(12) United States Patent
Rodda

(10) Patent No.: US 9,164,126 B1
(45) Date of Patent: Oct. 20, 2015

(54) WRIST METER-MOUNT SYSTEM

(71) Applicant: Patrick Rodda, Tucson, AZ (US)

(72) Inventor: Patrick Rodda, Tucson, AZ (US)

(73) Assignee: Meterist LLC, Tucson, AZ (US)

( * ) Notice: Subject to any disclaimer, the term of this patent is extended or adjusted under 35 U.S.C. 154(b) by 182 days.

(21) Appl. No.: 13/950,145

(22) Filed: Jul. 24, 2013

(51) Int. Cl.
*A45F 5/00* (2006.01)
*A45F 5/02* (2006.01)
*G01R 1/04* (2006.01)

(52) U.S. Cl.
CPC ... *G01R 1/04* (2013.01); *A45F 5/00* (2013.01); *A45F 5/02* (2013.01); *A45F 2005/008* (2013.01)

(58) Field of Classification Search
CPC ............... A45F 5/00; A45F 2005/008; A45F 2200/0516; A45F 5/02; A45F 2003/006
USPC .................. 224/219, 222, 267, 183
See application file for complete search history.

(56) References Cited

U.S. PATENT DOCUMENTS

| | | | |
|---|---|---|---|
| 4,453,294 A | 6/1984 | Morita | |
| 5,004,425 A | 4/1991 | Hee | |
| 5,117,444 A | 5/1992 | Sutton | |
| 5,607,091 A * | 3/1997 | Musacchia | 224/222 |
| 5,781,511 A | 7/1998 | Yasukawa et al. | |
| 5,986,446 A | 11/1999 | Williamson | |
| 5,988,469 A * | 11/1999 | Musacchia | 224/267 |
| 6,149,116 A * | 11/2000 | Won | 248/309.4 |
| 6,360,928 B1 * | 3/2002 | Russo | 224/218 |
| 6,502,727 B1 * | 1/2003 | Decoteau | 224/162 |
| 6,888,940 B1 * | 5/2005 | Deppen | 379/446 |
| 6,940,270 B2 | 9/2005 | Chen | |
| 7,296,752 B2 * | 11/2007 | Carnevali | 235/462.44 |
| 7,333,914 B1 | 2/2008 | Iachini | |
| 7,334,711 B1 * | 2/2008 | Winters | 224/217 |
| 7,424,110 B1 * | 9/2008 | Whiten, III | 379/454 |
| 7,529,155 B2 * | 5/2009 | Fasciano | 368/10 |
| 7,942,293 B2 * | 5/2011 | Lawrence et al. | 224/218 |
| 8,328,055 B1 * | 12/2012 | Snyder | 224/197 |
| 8,662,362 B1 * | 3/2014 | Bastian et al. | 224/218 |
| 8,936,222 B1 * | 1/2015 | Bastian et al. | 248/206.5 |
| 8,939,333 B2 * | 1/2015 | Ivarez | 224/219 |
| 2009/0321483 A1 * | 12/2009 | Froloff | 224/267 |
| 2010/0327030 A1 * | 12/2010 | Yang | 224/199 |
| 2011/0224564 A1 | 9/2011 | Moom et al. | |
| 2012/0051193 A1 | 3/2012 | Yu | |
| 2012/0080462 A1 * | 4/2012 | Hajarian | 224/219 |
| 2012/0101602 A1 | 4/2012 | Andren et al. | |
| 2013/0151699 A1 | 6/2013 | Vock et al. | |

\* cited by examiner

*Primary Examiner* — J. Gregory Pickett
*Assistant Examiner* — Lester L Vanterpool
(74) *Attorney, Agent, or Firm* — Invention To Patent Services; Alex Hobson

(57) ABSTRACT

A wrist meter-mount system having a meter mount configured to attach to a meter, and a wrist mount configured to attach a meter mount to a person's wrist is described. The meter mount and wrist mount are configured to be detachably attachable to each other by at least one magnet. The meter mount has a first set of engagement teeth that interface with a second set of engagement teeth on the wrist mount. The engagement teeth allow the meter to be rotationally positioned as desired on the wrist mount. The wrist meter-mount system allows a user to attach a meter to their wrist and use one or both hands to connect a probe or probes to a measurement location. In one embodiment, a wrist mount comprises a cantilevered base allowing an attached meter to be inclined up to a desired reading location.

13 Claims, 9 Drawing Sheets

WRIST METER-MOUNT SYSTEM

BACKGROUND OF THE INVENTION

1. Field of the Invention

The present invention relates to a wrist meter-mount system.

2. Background

Meters, such as multi-meters, having one or more probes that have to contact a measurement surface to obtain a reading are cumbersome and difficult to manipulate in many situations. Technicians are often in cramped locations when trying to take a reading with a meter. For example, a technician may have to contact one, or in some cases two probes, to different locations in order to obtain a reading. Finding a suitable location to rest the meter, whereby the probes can reach the measurement locations, and the meter can be seen; can be problematic. In some cases, a technician may have to touch the probes to contacts within a ceiling where there is no suitable location to rest the meter.

SUMMARY OF THE INVENTION

The invention is directed to a wrist meter-mount system and, in particular, a wrist meter-mount system for multi-meters. A meter, as used herein, has at least one probe that extends from the meter and is configured to contact a measurement location. In an exemplary embodiment, a wrist meter-mount system comprises a meter mount configured to attach to a meter, and a wrist mount configured to attach the meter mount to a person's wrist. The meter mount and wrist mount are configured to be detachably attachable to each other by at least one magnet. The meter mount has a first set of engagement teeth that interface with a second set of engagement teeth on the wrist mount. The engagement teeth allow the meter to be rotationally positioned as desired on the wrist mount. The wrist meter-mount system allows a user to attach a meter to their wrist mount and use one or both hands to connect a probe or probes to a measurement location. The meter can be positioned on the top side of the wrist or on the bottom side of the wrist depending on the location of measurement. For example, a meter attached to a meter mount may be attached to a wrist mount on the bottom portion of a person's wrist when taking measurements in a ceiling.

A meter mount comprises a meter attachment feature that is configured to retain, at least temporarily, a meter to the meter mount. A meter attachment feature may comprise any suitable means to attach a meter to the meter mount including, but not limited to, straps, adhesive, tape, snaps, hook and loop fasteners, elastomeric bands, and the like. In an exemplary embodiment, one portion of a hook and loop fastener is configured on the meter mount and an opposite, or complementary, portion of a hook loop fastener is configured on a meter. A meter may be quickly and easily attached to a meter mount in this embodiment. In addition, ant number of different meters may be configured with the complementary portion of hook and loop fastener, such that these meters may be quickly and easily interchanged with the meter mount. In another exemplary embodiment, a double-sided tape is attached to the meter mount, thereby allowing attachment of any meter to the meter mount. In still another embodiment, at least one hook and loop fastener strap is attached to the meter mount and configured to extend around a meter whereby a first portion of the hook and loop fastener can be coupled with a second portion of the hook and loop fastener.

A meter mount comprises a first magnetic coupler which may be a magnet or a magnetic metal. In one embodiment, a wrist mount comprises a magnet and the meter mount comprises a magnetic metal that is attracted to the magnet. In another embodiment, the meter mount comprises a magnet and the wrist mount comprises a magnetic metal. In still another embodiment, the meter mount comprises a magnet and the wrist mount also comprises a magnet that is configured to couple with the magnet in the meter mount.

A meter mount comprises a plurality of first engagement teeth that are configured to engage with a plurality of second engagement teeth configured on the wrist mount. Any suitable configuration of engagement teeth may be used. In an exemplary embodiment, a continuous ring of saw-tooth shaped engagement teeth are configured around the perimeter of a magnetic coupler. The engagement teeth may extend beyond a magnetic coupler as described herein. In an exemplary embodiment, the engagement teeth may extend up from the surface of the wrist mount and up from the surface of the meter mount. In another embodiment, engagement teeth extend in a radial direction from the magnetic coupler, whereby one set of engagement teeth extent outward with the tip extending away from a first magnetic coupler, and the other set extend inward, with the tip of the tooth pointing toward the center of the magnetic coupler. This configuration is referred to as an in-plane engagement teeth configuration.

A wrist mount comprises a wrist strap configured to temporarily retain the wrist mount on a person's wrist. A wrist strap may comprise elastomeric material, hook and loop fastener type material, a buckle, snaps, and/or any other suitable attachment means. In an exemplary embodiment, a wrist strap comprises a hook and loop fastener allowing for quick easy placement of the wrist mount on any size wrist. A wrist mount also comprises a second magnetic coupler which may be a magnet or a magnetic metal as described herein. In addition, a wrist mount comprises a plurality of second engagement teeth configured to engage with the plurality of first engagement teeth configured on the meter mount.

In an exemplary embodiment, a plurality of second engagement teeth are configured in a ring around a second magnetic coupler, thereby allowing the meter mount to be rotationally positioned when attached to the wrist mount. The plurality of first and/or second engagement teeth may be configured in a continuous ring whereby there are substantially no gaps between the plurality of teeth. Engagement teeth may be configured to extend any suitable increment about a continuous ring including, but not limited to, about 30° or less, about 20° or less, about 10° or less, about 5° or less and any suitable range including the increments provided. It is to be understood that engagement teeth extending a smaller increment about a continuous ring will provide for finer rotational adjustment of a meter mount relative to the wrist mount. In one embodiment, the plurality of first or second teeth is configured in a continuous ring and the other plurality of teeth are in a discontinuous configuration. A magnetic coupler may have an outside perimeter and a plurality of first and/or second engagement teeth may be configured around the outside perimeter of a magnetic coupler. Engagement teeth may have any suitable shape and size including, but not limited to a saw-tooth shape, a square shape, rectangular shape, curved shape and the like. In an exemplary embodiment, the plurality of engagement teeth have a continuous saw-tooth geometry, and may be configured in a ring around the perimeter of a magnetic coupler.

The wrist mount may comprise a cantilevered base whereby the meter may be tilted up and away from the wrist for better visibility. A cantilevered base may be coupled to a wrist mount base by a hinge. A cantilevered base may be configured with cantilever stops that allow the cantilevered base to be retained and a plurality of positions. Cantilever stops may be configured between the cantilevered base and the wrist mount base. Cantilever stops may be a plurality of interfering portions between the cantilevered base and the wrist mount base. A substantial force may be required to overcome the cantilever stops and move the cantilevered base to a new position. In another embodiment, a hinge comprises a hinge tightening feature that may be used to secure the cantilever base in a position. For example, a user may position the cantilevered base and then tighten the hinge tightening feature to secure the cantilevered base in that position.

In an embodiment, one of the magnetic couplers extends beyond the respective plurality of teeth whereby when the plurality of first and second engagement teeth engage, the extended magnetic coupler is within the opposing plurality of teeth. This configuration more substantially locks the meter mount to the wrist mount. In an exemplary embodiment, the first magnetic coupler extends beyond the plurality of first engagement teeth and a second magnetic coupler may be recessed within the plurality of second engagement teeth. In this exemplary embodiment, the first magnetic coupler will prevent the meter mount from sliding when it is engaged with a second magnetic coupler. In an alternative embodiment, the second magnetic coupler extends beyond the plurality of second engagement teeth and seats within the plurality of first engagement teeth.

In an embodiment, the wrist mount comprises a plurality of rotational stops, whereby the meter mount may be rotated relative to the wrist mount when the first and second plurality of engagement teeth are engaged.

The summary of the invention is provided as a general introduction to some of the embodiments of the invention, and is not intended to be limiting. Additional example embodiments, including variations and alternative configurations of the invention, are provided herein.

BRIEF DESCRIPTION OF THE DRAWINGS

The accompanying drawings are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
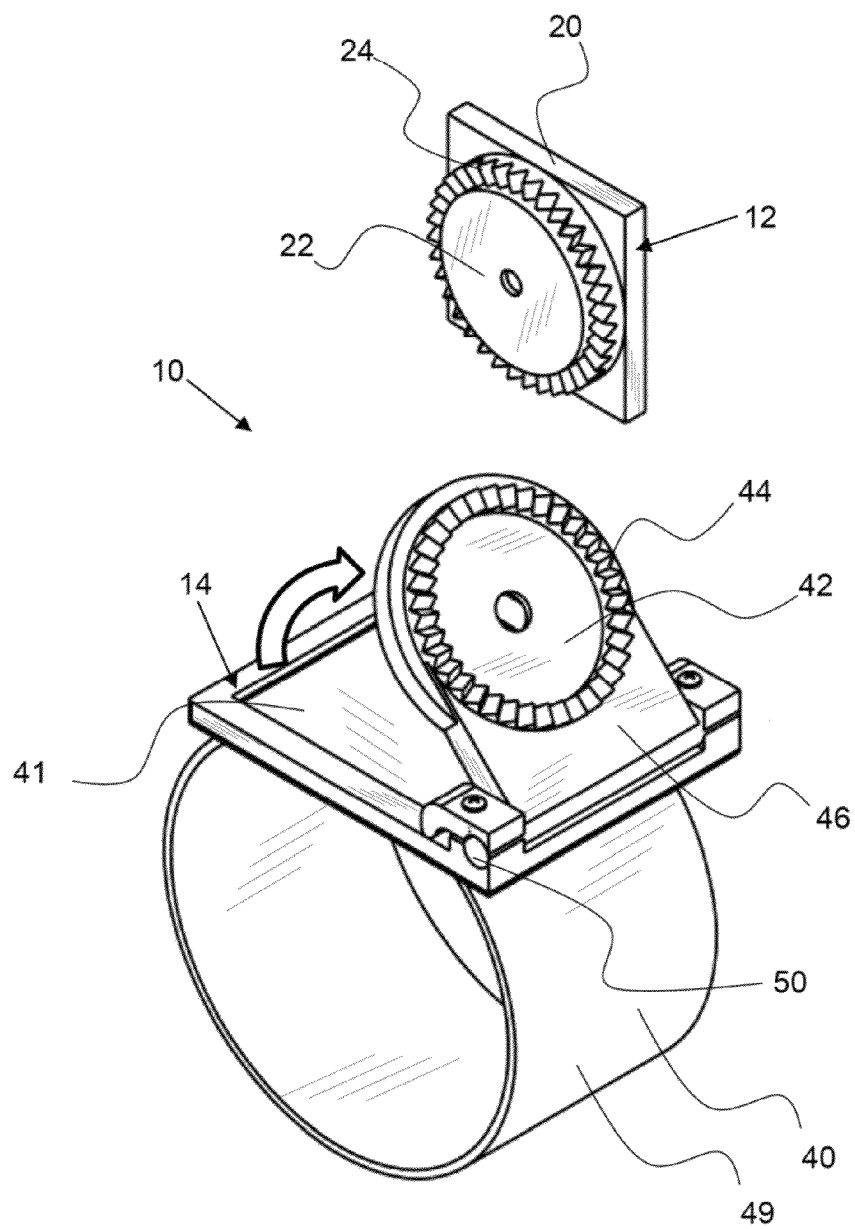

FIG. 1 shows a perspective view of an exemplary wrist meter-mount comprising a meter mount and a wrist mount.

Figure 2:
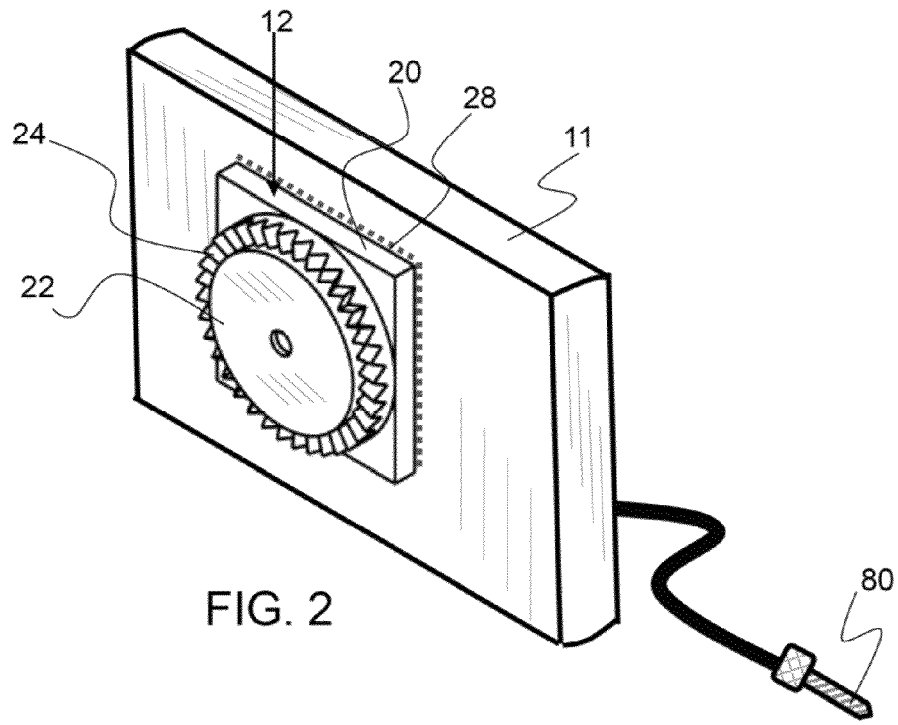

FIG. 2 shows a perspective view of an exemplary meter mount attached to a meter.

Figure 3:
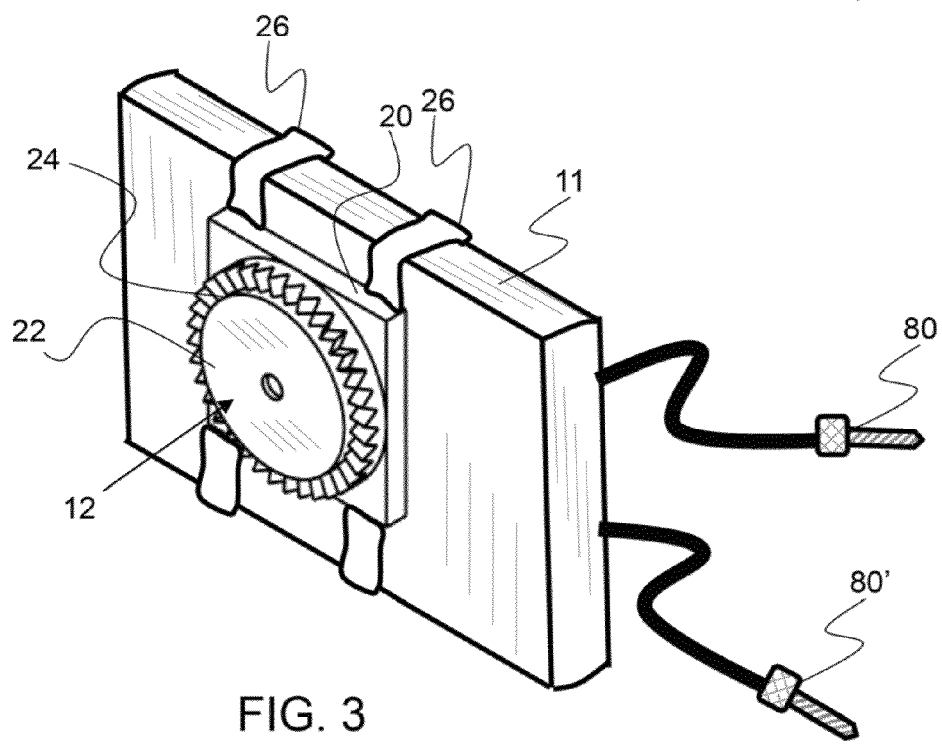

FIG. 3 shows a perspective view of an exemplary meter mount attached to a meter.

Figure 4:
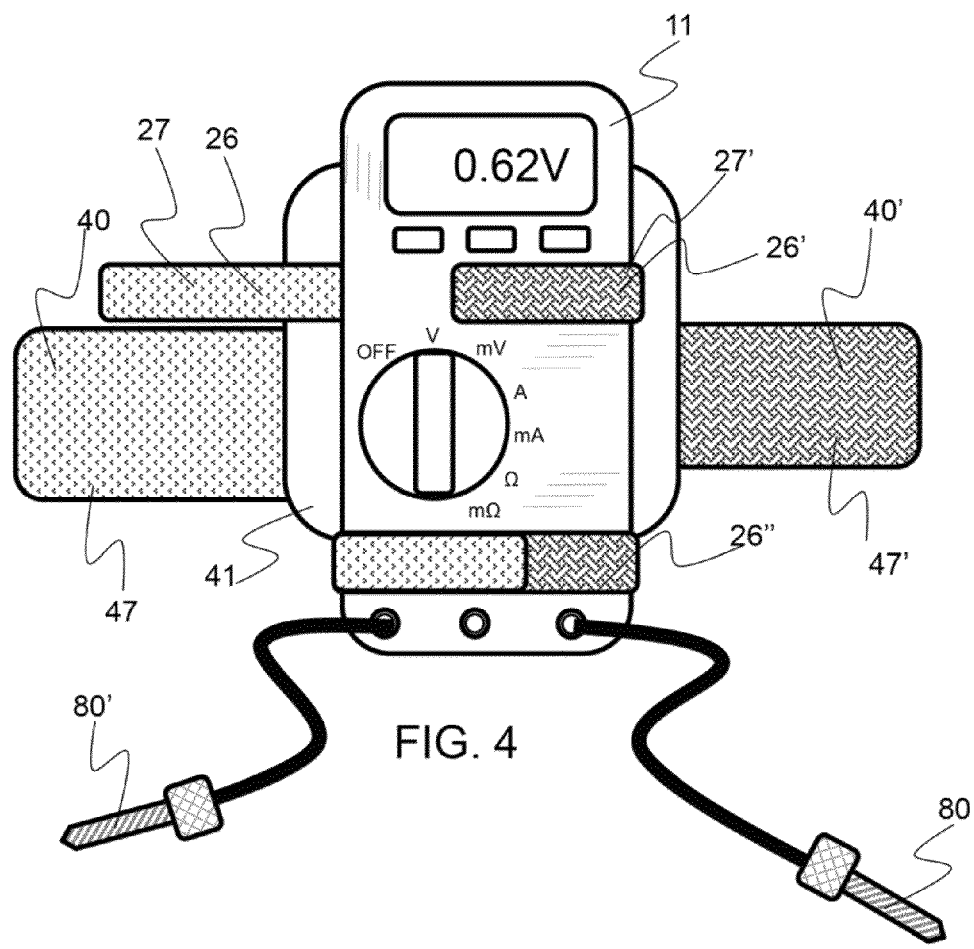

FIG. 4 shows a top-down view of an exemplary meter attached to a wrist meter-mount.

Figure 5:
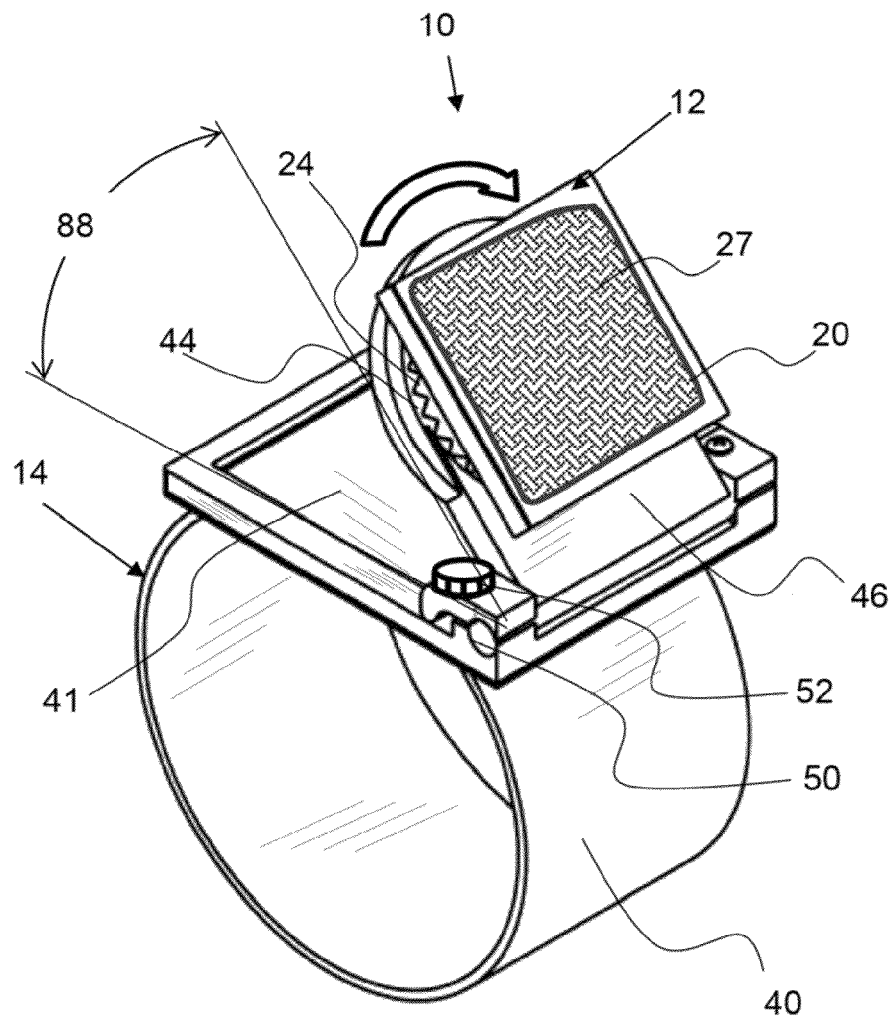

FIG. 5 shows a perspective view of an exemplary wrist meter-mount having a meter mount attached to a cantilevered base in an inclined position.

Figure 6:
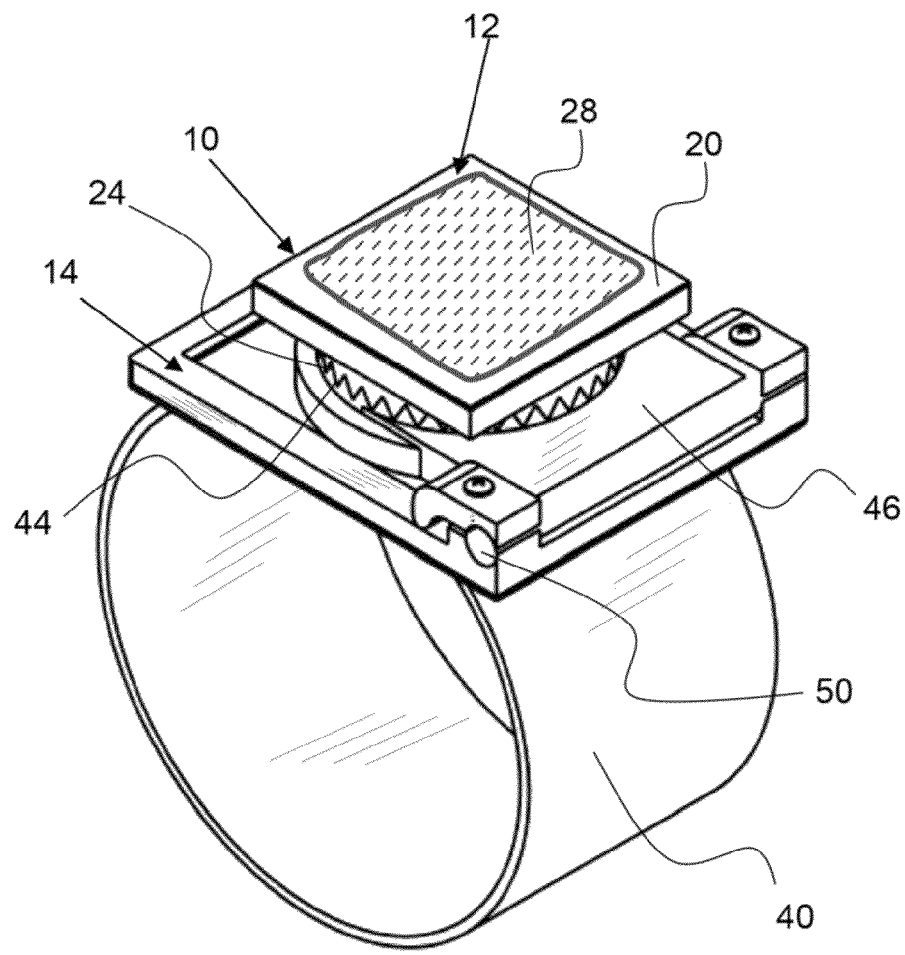

FIG. 6 shows a perspective view of an exemplary wrist meter-mount having a meter mount attached to a cantilever base in a down position.

Figure 7:
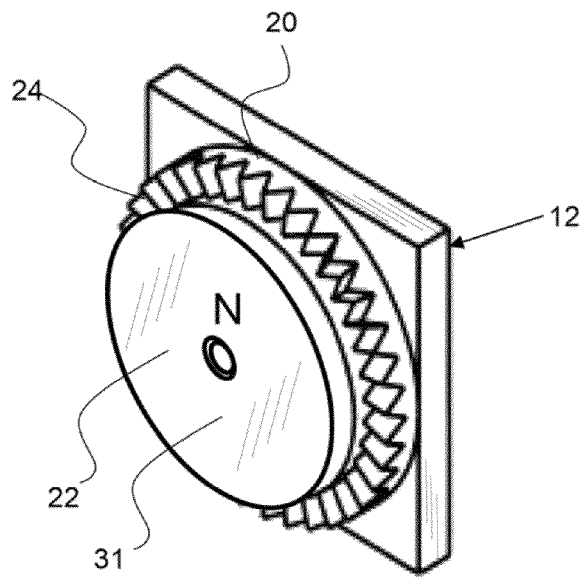

FIG. 7 shows a perspective view of an exemplary meter mount having a first magnetic coupler extending out beyond a plurality of first engagement teeth.

Figure 8:
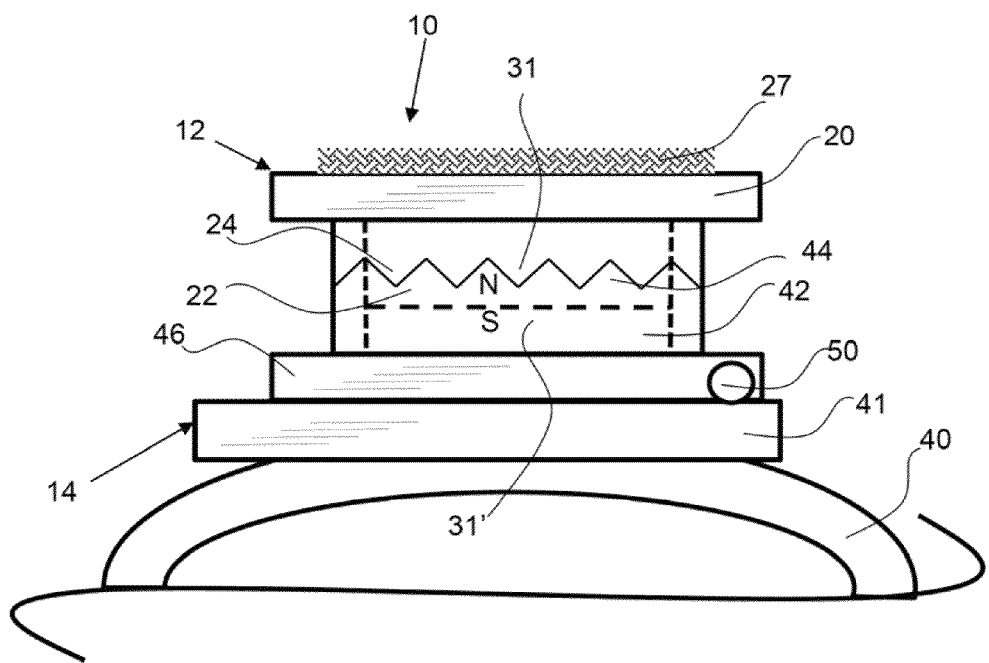

FIG. 8 shows a side view of an exemplary wrist meter-mount having a first magnetic coupler extending into a plurality of second engagement teeth.

Figure 9:
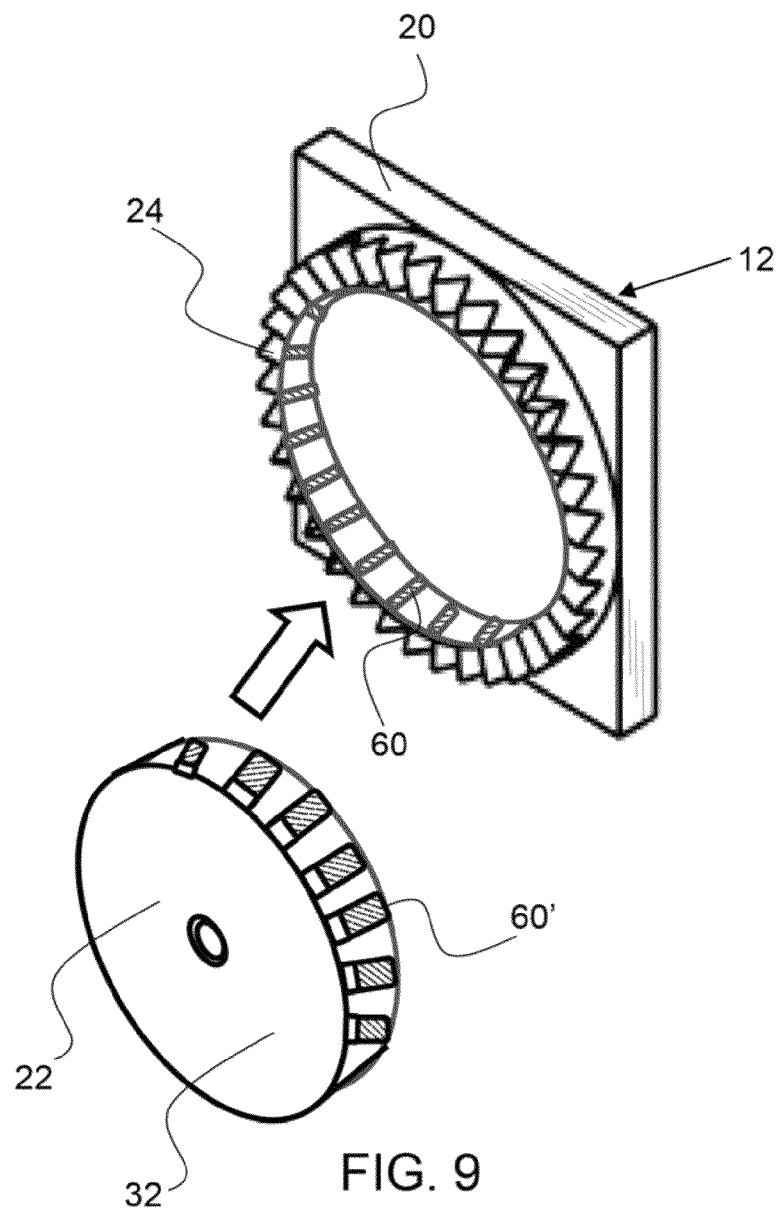

FIG. 9 shows a perspective view of an exemplary meter mount having rotational stops configured around a first magnetic coupler and within the perimeter of a plurality of first engagement teeth.

Figure 10:
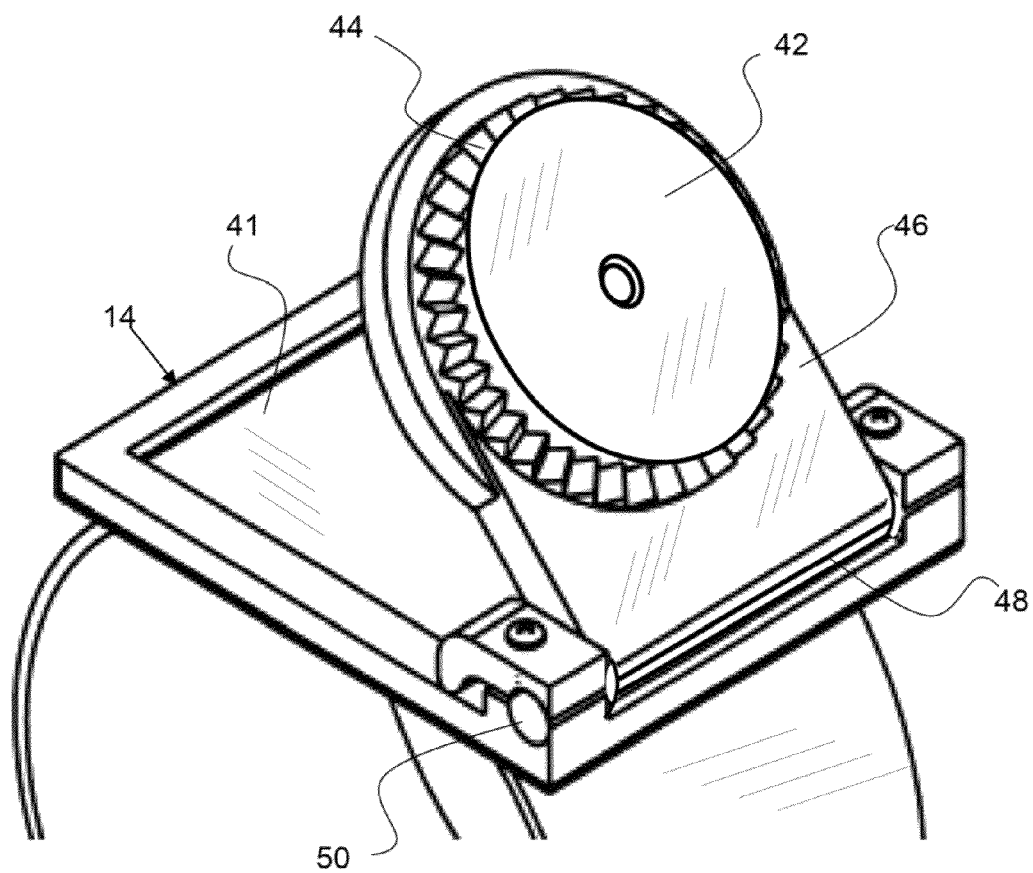

FIG. 10 shows a perspective view of an exemplary wrist mount having a cantilevered base and a plurality of cantilever stops.

Figure 11:
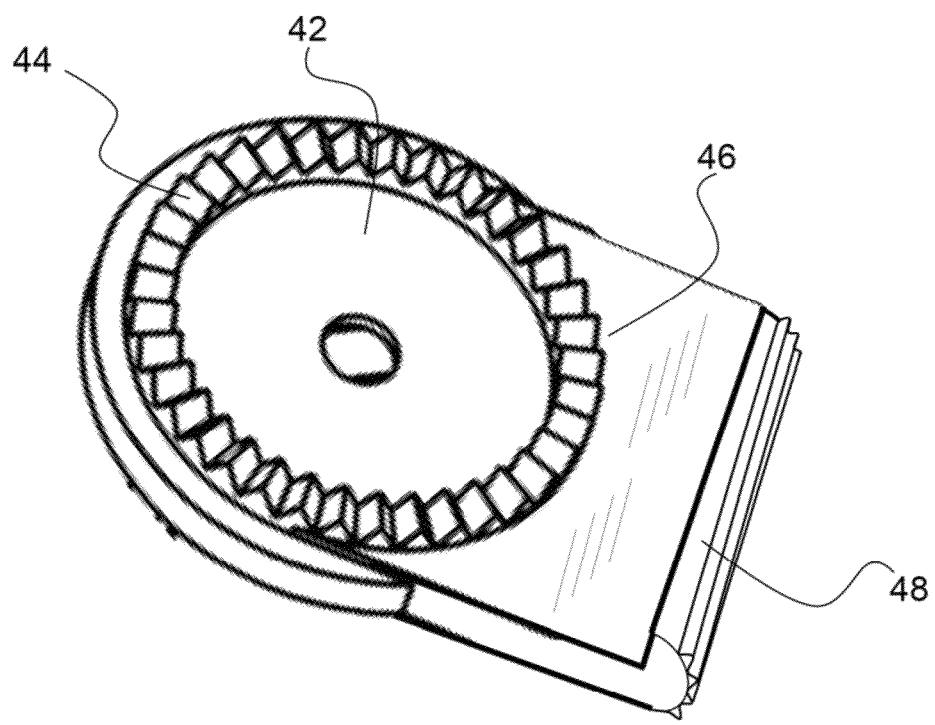

FIG. 11 shows a perspective view of an exemplary cantilevered base having a plurality of cantilever stops.

Corresponding reference characters indicate corresponding parts throughout the several views of the figures. The figures represent an illustration of some of the embodiments of the present invention and are not to be construed as limiting the scope of the invention in any manner. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Certain exemplary embodiments of the present invention are described herein and illustrated in the accompanying figures. The embodiments described are only for purposes of illustrating the present invention and should not be interpreted as limiting the scope of the invention. Other embodiments of the invention, and certain modifications, combinations and improvements of the described embodiments, will occur to those skilled in the art and all such alternate embodiments, combinations, modifications, improvements are within the scope of the present invention.

As shown in FIG. 1, an exemplary wrist meter-mount 10 comprises a meter mount 12 and a wrist mount 14. The meter mount comprises a base 20 and a plurality of first engagement teeth 24 extending up from the surface of the meter mount. A first magnetic coupler 22 is configured inside of the plurality of first engagement teeth. The first magnetic coupler 22 extends out beyond the plurality of first engagement teeth and is configured to seat within the plurality of second engagement teeth 44 of the wrist mount 14 that extend up from the cantilevered base 46. The wrist mount 14 comprises a wrist strap 40 that is configured to extend around a person's wrist. As shown in FIG. 1, the wrist strap is an elastomeric band 49. The wrist mount 14 comprises a cantilevered base 46 that is in an up, or inclined position, as indicated by the large art arrow. The second magnetic coupler 42 and plurality of second engagement teeth 44 are configured on the cantilevered base. The second magnetic coupler 42 is recessed within the plurality of second engagement teeth 44. A hinge 50 allows the cantilevered base to incline up and away from the wrist mount base 41.

As shown in FIG. 1, the plurality of first and second engagement teeth are configured in a continuous ring-shape, whereby the saw-tooth shaped engagement teeth extend in a continuous manner about the perimeter of the magnetic coupler. The plurality of engagement teeth may be configured in any suitable way, however. A magnetic coupler may be configured under the engagement teeth and still provide adequate coupling force when the wrist mount is coupled with the meter mount, for example. There may be any suitable number of engagement teeth configured around a magnetic coupler including, but not limited to, more than about six, more than about ten, more than about 20, more than about 30, more than about 60, more than about 90, more than about 120 and any range between and including the number of teeth listed. It is to be understood that the number of teeth configured about a magnetic coupler may relate to the rotational increments. For example, 60 engagement teeth configured about a magnetic coupler may provide a 6° rotational increment, whereas 30 engagement teeth may provide a 12° rotational increment.

As shown in FIG. 2, a meter 11 is attached to an exemplary meter mount 12. Tape 28, such as double-sided tape, is configured between the meter mount base 20 and the meter 11. A single probe 80 extends from the meter 11.

As shown in FIG. 3, an exemplary meter mount 12 is attached to a meter 11 by meter straps 26, 26'. These straps may be elastomeric or may comprise hook and loop fastener material. Straps may allow for the quick exchange of a first meter to a second meter. Two probes 80 and 80' extend from the meter 11.

As shown in FIG. 4, an exemplary meter 11 is attached to a wrist meter-mount 10. Straps 26 are used to couple the meter to the wrist mount (not shown). The straps 26 comprise hook and loop fastener material 27. These types of straps may accommodate meters of different dimensions. In addition, the wrist strap 40 comprises hook and loop fastener material 47 that may more effectively provide secure attachment to a variety of wrist sizes. The meter 11 has a readout and two probes 80. The meter shown in FIG. 4 is a multi-meter.

As shown in FIG. 5, an exemplary wrist meter-mount 10 has a meter mount 12 attached to a cantilevered base 46 in an inclined position. A hinge tightening feature 52 is configured to retain the cantilevered base in a desired position. A person may incline the cantilever base and then tighten the hinge tightening feature to retain the calendar base in that position. The incline angle 88 of the cantilevered base 46 with respect to the wrist mount base 41 may extend to any suitable angle including, but not limited to, about 20° or more, about 30° or more, about 45° or more, about 60° or more, about 90° or more, about 120° or more, about 180° and any range between and including the incline angles provided. In this embodiment, the wrist mount 12 is configured to rotate as indicated by the large art arrow. A rotational feature may be configured to allow a person to rotate a meter as desired to provide a better viewing angle. In this embodiment, an attached meter has two degrees of freedom, inclining by the cantilevered base, and, rotating. A hook and loop fastener material 27 is attached to the wrist mount base 20. A complementary hook and loop fastener material may be attached to the backside of a meter for coupling the meter to the meter mount. A plurality of meters having a hook and loop fastener material may be quickly interchanged with this embodiment.

As shown in FIG. 6, an exemplary wrist meter-mount 10 has a meter mount 12 attached to a cantilevered base 46 in a down position. A tape 28, such as a double-sided tape, is configured on the wrist mount base 20. A double-sided tape may allow attachment of any meter to the wrist meter-mount 10.

As shown in FIG. 7, an exemplary meter mount 12 has a first magnetic coupler 22 extending out beyond a plurality of first engagement teeth 24. The first magnetic coupler 22 is a magnet 31 configured with a north side facing out, as indicated by the "N".

As shown in FIG. 8, an exemplary wrist meter-mount 10 has a first magnetic coupler 22 extending into a plurality of second engagement teeth 44. The horizontal dashed line indicates the depth of penetration of the first magnetic coupler 22 into the plurality of second engagement teeth 40. This geometry will prevent the wrist mount 12 from sliding when engaged with the wrist mount. The first magnetic coupler configured within the plurality of second engagement teeth prevents movement in plane of the magnetic coupler. The first magnetic coupler 22 is coupled with the second magnetic coupler 42 having a magnetic south side, as indicated by the "S", facing out or away from the wrist strap. As described herein, one of the magnetic couplers may be a metal that is attracted to a magnet.

As shown in FIG. 9, an exemplary meter mount 12 has rotational stops 60 configured around a first magnetic coupler 22 and within the perimeter of a plurality of first engagement teeth 24. These rotational stops may allow the wrist mount base 20 and attached meter to rotate as desired. The rotational stops may provide resistance whereby the meter base may be rotated and retained by the stops in a desired location. A substantial amount of force may be required to overcome the interference of the rotational stops 60 with rotational stops 60'. Any suitable configuration of stops may be utilized to provide a rotational feature. The wrist mount base, for example, may comprise a plurality of stops and rotate about the first magnetic coupler and the plurality of first engagement teeth. Likewise, rotational stops may be configured in any suitable location on the wrist mount.

As shown in FIG. 10, an exemplary wrist mount 14 has a cantilevered base 46 and a plurality of cantilever stops 48. The cantilever stops comprise ridges extending from the cantilevered base that engage with complementary ridges and/or recesses on the wrist mount base 41. A substantial amount of force may be required to overcome the interference of cantilever stops in a set position. The cantilever base may click into any number of incline positions and be retained in a desired position.

As shown in FIG. 11, an exemplary cantilevered base 46 has a plurality of cantilever stops 48. This isometric view more clearly shows the ridges of the cantilever stops 48 that extend along the cantilever base.

A wrist meter-mount as described herein may be made out of any suitable material. For example, the meter mount may comprise a plastic injection molded portion and a first magnetic coupler comprising a magnetic metal. Likewise, a wrist mount may comprise one or more plastic injection molded portions, a second magnetic coupler comprising a magnetic metal, and the strap. In an exemplary embodiment the wrist meter-mount is made out of materials to minimize weight.

DEFINITIONS

A meter, as used herein, is defined as an electronic device that measures an electrical response through contact with at least one probe that extends from the meter and is configured to be positioned by hand. In an exemplary embodiment, a probe is coupled to the meter by a cable having a length of at least 5 inches. In another exemplary embodiment, a meter has two probes that extend from the meter. A meter may comprise a power supply and a measurement circuit for measuring voltage, current, or resistance.

A magnetic coupler, as used herein, is defined as a magnet or a material that is attracted by a magnetic field including, but not limited to, iron, cobalt, nickel and some alloys of rare earth metals.

The term coupled, as used herein in relation to the first and second magnetic couplers being coupled, means that the first magnetic coupler is in close enough proximity to the second magnetic coupler to create a substantial force there between. The first magnetic coupler may physically contact the second magnetic coupler when they are coupled or there may be a space due to the engagement of the plurality of first and second engagement teeth. When the first magnetic coupler and second magnetic coupler are both magnets they are configured such that one of the magnetic couplers has a north pole, "N," configured to face the south pole, "S," of the other magnetic coupler when they are coupled.

It will be apparent to those skilled in the art that various modifications, combinations and variations can be made in the present invention without departing from the spirit or scope of the invention. Specific embodiments, features and elements described herein may be modified, and/or combined in any suitable manner. Thus, it is intended that the present invention cover the modifications, combinations and variations of this invention provided they come within the scope of the appended claims and their equivalents.

What is claimed is:

1. A wrist meter-mount system comprising:
   a. a meter mount comprising:
      i. a base;
      ii. a first magnetic coupler comprising a first magnet;
      iii. a plurality of first engagement teeth configured in a continuous ring around said first magnet in increments of 20° or less;
         wherein the plurality of first engagement teeth extend up from said base and wherein the first magnet protrudes out from said continuous ring;
   b. a wrist mount comprising:
      i. a second magnetic coupler;
      ii. a plurality of second engagement teeth configured in a continuous ring around said second magnetic coupler in increments of 20° or less;
      iii. a wrist strap;
         wherein the second magnetic coupler is recessed within the continuous ring of plurality of second engagement teeth;
         whereby when the meter mount is engaged with the wrist mount, the first magnet extends into the continuous ring of the wrist mount;
   whereby said plurality of first engagement teeth are configured to engage with said plurality of second engagement teeth to retain said meter mount in a rotational position relative to said wrist mount when said first magnetic coupler and said second magnetic coupler are coupled together.

2. The wrist meter-mount system of claim 1, wherein the second magnetic coupler comprises a magnetic metal.

3. The wrist meter-mount system of claim 1, the second magnetic coupler comprises a magnet configured to couple with said first magnetic coupler.

4. The wrist meter-mount system of claim 1, wherein the first magnet has a circular outside perimeter and wherein the plurality of first engagement teeth are configured around said outside perimeter of said first magnet.

5. The wrist meter-mount system of claim 1, wherein the second magnetic coupler has a circular outside perimeter and wherein the plurality of second engagement teeth are configured around said outside perimeter of said second magnetic coupler.

6. The wrist meter-mount system of claim 1, wherein the plurality of first and second engagement teeth comprise teeth configured in increments of 10 degrees or less.

7. The wrist meter-mount system of claim 6, wherein the plurality of first engagement teeth and the plurality of second engagement teeth consist of a plurality of saw-tooth shaped teeth.

8. The wrist meter-mount system of claim 1, further comprising a plurality of rotational stops, whereby the meter mount may be rotated relative to the wrist mount when the first magnetic coupler and the second magnetic coupler are coupled together.

9. The wrist meter-mount system of claim 1, wherein the meter mount comprises at least one meter strap for coupling said meter mount to a meter.

10. The wrist meter-mount system of claim 1, wherein the wrist mount further comprises:
    i. a cantilevered base;
    ii. a hinge;
wherein said cantilevered base is coupled to the wrist mount base by said hinge and is configured to be inclined up from the wrist mount base.

11. The wrist meter-mount system of claim 10, wherein the cantilever base may be actuated up from wrist mount base an incline angle of about 20 degrees or more.

12. The wrist meter-mount system of claim 10, further comprising a plurality of cantilever stops, whereby the cantilevered base may be retained in an inclined position.

13. The wrist meter-mount system of claim if wherein the hinge further comprises a hinge tightening feature.

* * * * *